(12) United States Patent
Su

(10) Patent No.: US 9,890,276 B2
(45) Date of Patent: Feb. 13, 2018

(54) COMPOSITE MATERIAL, HIGH-FREQUENCY CIRCUIT SUBSTRATE MADE THEREFROM AND MAKING METHOD THEREOF

(75) Inventor: Ming-She Su, Dongguan (CN)

(73) Assignee: GUANGDONG SHENGYI SCI. TECH CO., LTD (CN)

( * ) Notice: Subject to any disclaimer, the term of this patent is extended or adjusted under 35 U.S.C. 154(b) by 332 days.

(21) Appl. No.: 13/809,893

(22) PCT Filed: Jul. 14, 2010

(86) PCT No.: PCT/CN2010/075149
§ 371 (c)(1),
(2), (4) Date: Mar. 28, 2013

(87) PCT Pub. No.: WO2012/006776
PCT Pub. Date: Jan. 19, 2012

(65) Prior Publication Data
US 2013/0180770 A1    Jul. 18, 2013

(51) Int. Cl.
| | | |
|---|---|---|
| *C08L 47/00* | (2006.01) | |
| *H05K 3/02* | (2006.01) | |
| *H05K 1/03* | (2006.01) | |
| *H05K 3/44* | (2006.01) | |
| *C08L 71/12* | (2006.01) | |

(52) U.S. Cl.
CPC ............ *C08L 47/00* (2013.01); *C08L 71/126* (2013.01); *H05K 1/0313* (2013.01); *H05K 3/022* (2013.01); *H05K 3/44* (2013.01); *H05K 1/0373* (2013.01); *H05K 2201/012* (2013.01)

(58) Field of Classification Search
CPC .... H05K 3/022; H05K 1/0313; H05K 1/0373; H05K 2201/012; H05K 3/44
USPC ......................... 156/307.1; 174/258; 524/572
See application file for complete search history.

(56) References Cited

U.S. PATENT DOCUMENTS

| | | | |
|---|---|---|---|
| 5,571,609 A | 11/1996 | St. Lawrence et al. | |
| 6,569,943 B2 | 5/2003 | Lane et al. | |
| 6,878,782 B2 | 4/2005 | Merfeld et al. | |
| 8,115,105 B2 | 2/2012 | Amou et al. | |
| 8,227,361 B2 | 7/2012 | Amou et al. | |
| 8,227,948 B1 | 7/2012 | Fox et al. | |
| 2002/0028337 A1* | 3/2002 | Yeager et al. ................ | 428/461 |
| 2007/0184255 A1* | 8/2007 | Chiang et al. ............. | 428/292.1 |
| 2010/0129676 A1 | 5/2010 | Fujimoto et al. | |
| 2010/0173163 A1* | 7/2010 | Tsuchikawa et al. ......... | 428/413 |

FOREIGN PATENT DOCUMENTS

| | | |
|---|---|---|
| CN | 1280337 C | 10/2006 |
| WO | 9738564 | 10/1997 |

\* cited by examiner

*Primary Examiner* — Peter F Godenschwager
(74) *Attorney, Agent, or Firm* — McDonald Hopkins LLC

(57) ABSTRACT

The present invention relates to a composite material, a high-frequency circuit substrate made therefrom and a making method thereof. The composite material comprises: thermosetting mixture including more than one liquid vinyl resin with the molecular weight being less than 10000 containing polar functional groups, and a polyphenylene ether resin with the molecular weight being less than 5000 containing unsaturated double bonds at the molecule terminal; fiberglass cloth; powder filler; flame retardant and cure initiator. The high-frequency circuit substrate made from the composite material comprises a plurality of prepregs mutually overlapped, and copper foils respectively covered on both sides of overlapped prepregs; each prepreg is made from the composite material. The composite material of the prevent invention realizes easy manufacturing of the prepregs and high bonding force to the copper foil. The high-frequency circuit substrate made from the composite material has low dielectric constant, low dielectric loss tangent, and excellent heat resistance, and is convenient for process operation. Therefore, the composite material of the present invention is suitable for making the circuit substrate of a high-frequency electronic equipment.

7 Claims, No Drawings

COMPOSITE MATERIAL, HIGH-FREQUENCY CIRCUIT SUBSTRATE MADE THEREFROM AND MAKING METHOD THEREOF

RELATED APPLICATION

This application is a continuation of International application No. PCT/CN2010/075149, filed on Jul. 14, 2010.

FIELD OF THE INVENTION

The present invention relates to a composite material, a high-frequency circuit substrate made therefrom and a making method thereof, particularly relates to a thermosetting dielectric composite material, a high-frequency circuit substrate made therefrom and a making method thereof.

BACKGROUND OF THE INVENTION

In recent years, with computers and information communication equipments developing toward high performance, high function and networking, to transmit and process large-capacity information at high speed, operation signals tend to be high-frequency. Therefore, the material of the circuit substrate material is required to be improved.

Among the conventional materials used for a printed circuit substrate, epoxy resins with excellent adhesion characteristics are widely used. However, an epoxy resin circuit substrate generally has relatively high dielectric constant and dielectric loss tangent (the dielectric constant is more than 4, and the dielectric loss tangent is around 0.02), and inadequate high-frequency characteristics, which result in failure in meeting the requirement of high-frequency signals. Therefore, it is required to develop resins with excellent dielectric properties, that is, resins having low dielectric constant and dielectric loss tangent. For a long time, technicians in the field have studied thermosetting polybutadiene or copolymer resin of polybutadiene and styrene, which have excellent dielectric properties. The results of these studies are cited as the following.

PCT patent application (WO97/38564) disclosed a circuit substrate made from nonpolar styrene-polybutadiene divinyl benzene terpolymer with magnesium aluminum silicate as a filler and fiberglass cloth as a reinforcing material being added in, which has excellent dielectric properties but poor heat resistance. The glass transition temperature of the circuit substrate is only about 100° C., and the coefficient of thermal expansion is very large, so it is hard to meet the high temperature (over 240° C.) requirement in the lead free process of manufacturing PCBs.

A US patent (U.S. Pat. No. 5,571,609) disclosed a circuit substrate made from 1,2-polybutadiene resin or polyisoprene with molecular weight being less than 5000, polybutadiene styrene copolymer with high molecular weight, lots of silica as a filler, and fiberglass cloth as a reinforcing material, which has excellent dielectric properties. However, in the patent, a component with high molecular weight is adopted to improve the sticky property of the prepregs, so the processing property of the process of manufacturing prepregs becomes bad. Moreover, the proportion of rigid structure benzene ring in the resin molecule of the whole resin system is very small, and the cross-linked segments are mostly composed of methylene with very low rigidity. So, the made sheet has poor rigidity and very low flexural strength.

A US patent (U.S. Pat. No. 6,569,943) disclosed a circuit substrate made from amine modifier polybutadiene liquid resin with vinyl at the molecule terminal, lots of monomers (styrene dibromide) of low molecular weight as a curing agent and diluent, and impregnate fiberglass cloth, which has excellent dielectric properties. However, for the resin system is liquid at normal temperature, it can not be made into non-sticky prepregs. Therefore, in the compression moulding of sheets, it is difficult to adopt common stacked technology of prepregs, which results in difficult process operation.

Chinese patent No. CN1280337C used polyphenylene ether resin with unsaturated double bonds at the molecule terminal, and adopted vinyl monomer (such as styrene dibromide) of low molecular weight as a curing agent. However, since these monomers of low molecular weight have a low boiling point, which will volatilize during the drying process of impregnating fiberglass cloth to make a prepreg, the usage amount of the curing agent can not ensure to be enough. Besides, although the patent disclosed that polybutadiene resins can be used to improve the viscosity of the system, it did not clearly disclose that polybutadiene resins with polarity groups were adopted and polybutadiene resins with polarity groups were adopted to improve the peel strength.

The above said patents or patent applications still have a conspicuous problem, that is, the peel strength of the made copper cladded sheet is low (less than 0.8 N/mm), which causes the made copper cladded sheet to have the risk of the circuit peeling off while processing PCB circuits or using the equipments.

SUMMARY OF THE INVENTION

An object of the present invention is to provide a composite material, which can provide a high-frequency circuit substrate with adequate high-frequency dielectric properties, high temperature resistance, high peel strength of circuit substrate, and good processing property.

Another object of the present invention is to provide a high-frequency circuit substrate made from the above mentioned composite material, which has high-frequency dielectric properties, high temperature resistance, and high peel strength of circuit substrate (the peel strength can be more than 1.0 N/mm).

A further object of the present invention is to provide a making method of the high-frequency circuit substrate made from the above mentioned composite material, by improving the resin system of the composite material and impregnating fiberglass cloth to make non-sticky prepregs, which can adopt common automatic stacked technology in the compression moulding of the sheets, whereby the process operation is more convenient.

To achieve the above mentioned objects, the present invention provides a composite material, which comprises (calculating according to the parts by weight of the total weight of the composite material):

(1) 20-70 parts by weight of thermosetting mixture, the thermosetting mixture including more than one liquid vinyl resin with the molecular weight being less than 10000 containing polar functional groups, and a polyphenylene ether resin with the molecular weight being less than 5000 containing unsaturated double bonds at the molecule terminal;

(2) 10-60 parts by weight of fiberglass cloth;
(3) 0-55 parts by weight of powder filler;
(4) 1-3 parts by weight of cure initiator;
(5) 0-35 parts by weight of flame retardant.

The liquid vinyl resins with the molecular weight being less than 10000 containing polar functional groups comprise 15%-75% of the weight of the thermosetting mixture, of which the content of 1,2-addition vinyl in the molecular structure is preferably more than or equal to 70%. The liquid vinyl resins with the molecular weight being less than 10000 containing polar functional groups are selected from maleic anhydride modified polybutadiene resin, amine modified polybutadiene resin, terminal carboxyl group modified polybutadiene resin, terminal hydroxyl modified polybutadiene resin, maleic anhydride modified polybutadiene styrene copolymer, and acrylate modified polybutadiene styrene copolymer.

The polyphenylene ether resin with the molecular weight being less than 5000 containing unsaturated double bonds at the molecule terminal comprises 25%-85% of the weight of the thermosetting mixture. The polyphenylene ether resin with the molecular weight being less than 5000 containing unsaturated double bonds at the molecule terminal uses the liquid vinyl resins with the molecular weight being less than 10000 containing polar functional groups for curing crosslinked reaction.

The powder filler is one or more selected from crystalline silica, amorphous silica, spherical silica, titanium dioxide, strontium titanate, barium titanate, boron nitride, aluminium nitride, silicon carbide, alumina, fiberglass, polytetrafluoroethylene, polyphenylene sulfide, and poly(ether sulfones).

The composite material also comprises a bromine-containing or phosphorus-containing flame retardant. The bromine-containing flame retardant is decabromodiphenyl ether, decabromodiphenylethane, or ethylenebis(tetrabromophthalimide). The phosphorus-containing flame retardant is tris(2,6-dimethylphenyl)phosphin, 10-(2,5-dihydroxyphenyl)-9,10-dihydro-9-oxa-10-phosphaphenanthrene-10-Oxide, 2,6-(2,6-dimethylphenyl)phosphino phenyl, or 10-phenyl-9,10-dihydro-9-oxa-10-phosphaphenanthrene-10-Oxide.

The cure initiator preferably is dicumyl peroxide, tert-butyl peroxybenzoate, or 2,5-bis(2-ethylhexanoylperoxy)-2,5-dimethylhexane.

The composite material further comprises an auxiliary crosslinking agent that is selected from triallyl isocyanurate, triallyl cyanurate, divinylbenzene, and multifunction ACRYLATE.

Furthermore, the present invention provides a high-frequency circuit substrate made from the composite material, comprising: a plurality of prepregs mutually overlapped, and copper foils respectively covered on both sides of the overlapped prepregs; wherein, each prepreg is made from the above mentioned composite material.

Furthermore, the present invention also provides a making method of the above mentioned high-frequency circuit substrate, which includes the following steps:

Step 1. weighing the components of the composite material, which comprises: (1) 20-70 parts by weight of thermosetting mixture, including more than one liquid vinyl resin with the molecular weight being less than 10000 containing polar functional groups, and a polyphenylene ether resin with the molecular weight being less than 5000 containing unsaturated double bonds at the molecule terminal; (2) 10-60 parts by weight of fiberglass cloth; (3) 0-55 parts by weight of powder filler; (4) 1-3 parts by weight of cure initiator; (5) 0-35 parts by weight of flame retardant;

Step 2. mixing the weighed thermosetting mixture, powder filler, flame retardant and cure initiator, diluting the resin system to an appropriate viscosity with a solvent, evenly stirring and mixing to make the filler evenly disperse in the resin system thereby obtaining a glue solution, impregnating the fiberglass cloth in said glue solution and controlling the fiberglass cloth to be at an appropriate thickness, and then removing the solvent to form prepregs;

Step 3. overlapping a plurality of said prepregs, respectively cover a copper foil on both top and bottom surfaces of the overlapped prepregs, putting the prepregs and copper foil assembly into a press machine to cure with a curing temperature of 150-300° C. and a curing pressure of 25-70 Kg/cm$^2$, thereby forming said high-frequency circuit substrate.

The beneficial effects of the present invention are described as follows. Firstly, liquid vinyl resins containing polar functional groups that have excellent dielectric properties are used, so as to provide the necessary high-frequency dielectric properties and high temperature resistance to a circuit substrate by the cross-linking reaction of a great quantity of unsaturated double bonds in the resins, and the peel strength is improved.

Secondly, the polyphenylene ether resin containing unsaturated double bonds at the molecule terminal is used to improve the heat resistance and rigidity of the circuit substrate, and to increase the peel strength.

Thirdly, the solid polyphenylene ether resin containing unsaturated double bonds at the molecule terminal is used in conjunction with the liquid vinyl resins containing polar functional groups to improve the sticky problem of the prepregs caused by only using liquid resins.

In summary, the composite material of the present invention achieves manufacturing prepregs easily, and high bonding force to the copper foil. The high-frequency circuit substrate made from the composite material has low dielectric constant, low dielectric loss tangent, and good heat resistance, and is convenient to process operation. So the composite material of the present invention is suitable for manufacturing circuit substrates of high-frequency electronic equipments.

DESCRIPTION OF THE PREFERRED EMBODIMENTS

The present invention is best understood from the following detailed description with reference to the accompanying embodiments.

A. Components of the Composite Material

1. Resin System of Thermosetting Mixture

A first component of the composite material of the present invention is a thermosetting mixture, which is 20-70 parts by weight and preferably is 20-50 parts by weight (according to the parts by weight of the total weight of the composite material), and comprises: (1) more than one liquid vinyl resin with the molecular weight being less than 10000 containing polar functional groups; and (2) a polyphenylene ether resin with the molecular weight being less than 5000 containing unsaturated double bonds at the molecule terminal.

The component (1) is liquid vinyl resins containing polar functional groups, of which the molecular weight are less than 10000, and preferably are less than 7000. The component (1) is liquid at room temperature, and the viscosity of liquid resins is very low, therefore it is beneficial to the later impregnation process. Liquid vinyl resins with the molecular weight being less than 10000 containing polar functional groups comprise 15%-75% of the weight of the thermosetting mixture, of which the content of 1,2-addition vinyl in the molecular structure is more than 10%, preferably is more than 50%, and more preferably is more than or equal to 70%.

Liquid vinyl resins containing polar functional groups can provide a great quantity of unsaturated vinyl for curing cross-linked reaction, can increase cross-linking density in curing process, and can provide the circuit substrate with adequate high temperature resistance. Besides, liquid vinyl resins with the molecular weight being less than 10000 containing polar functional groups contain polarity groups, such as amino groups, hydroxy groups, carboxyl groups, maleic anhydride modified groups, and acrylate modified groups, to improve the adhesive force. These resins can be used by oneself or can be used after being mixed, which can effectively improve the peel strength of the sheet. The preferable resin is such as TE2000 (Japan Caoda), Ricon 131MA20 (Sartomer), and Poly bd 45CT (Sartomer).

The component (1) is all liquid at room temperature. If the prepregs are only made from them, the sticky problem will occur, which is not beneficial to the subsequent lamination process operation. So the solid component (2) is introduced to improve the sticky property of the prepregs.

The component (2) is a solid polyphenylene ether resin (PPO) containing unsaturated double bonds at the molecule terminal. By adding solid PPO resin, on one hand, the solid PPO resin is used in conjunction with the liquid resins containing vinyl reactive groups to improve the sticky problem of the prepregs caused by only using liquid resins. On the other hand, the PPO resin contains better rigid benzene ring in its molecular structure, so, comparing with the butadiene resin in the conventional patent, the rigid and mechanical strength of the made sheet is better. Moreover, the adhesive force of the PPO resin is very high, so, the peel strength of the sheet can be improved. The solid polyphenylene ether resin containing unsaturated double bonds at the molecule terminal comprises 25%-85% of the weight of the thermosetting mixture. When the usage amount of the solid polyphenylene ether resin is less than 25%, it can not obtain the object of improving the sticky problem and peel strength. When the usage amount is more than 85%, the processing property will become bad, and the effect of impregnating fiberglass cloth is bad. The polyphenylene ether resin with the molecular weight being less than 5000 containing unsaturated double bonds at the molecule terminal can be MX9000 (SABIC). The structural formula is shown as the following:

preferred filler is silica. The particle size medium value of the filler is 1-15 μm, and preferably is 1-10 μm; the filler with the particle size medium value of 1-15 μm has good dispersion in a liquid resin. An adoptable silica filler can be such as CE44I (CE minerals company), FB-35 (Denka company), or 525 (Sibelco company).

3. Fiberglass Cloth

In the composite material of the present invention, a fiberglass cloth is employed to improve the size stability of the substrate, and to reduce the contraction of the laminate resin in curing process. The usage amount of the fiberglass cloth is 10-60 parts by weight, and preferably is 30-57 parts by weight (according to the parts by weight of the total weight of the composite material). According to different requirements to the substrate, different fiberglass clothes can be used. Specifications of different fiberglass clothes are listed as the following Table 1.

TABLE 1

| type | thickness (mm) | manufacturer |
|------|----------------|--------------|
| 7628 | 0.18           | Shanghai honghe |
| 2116 | 0.094          | Shanghai honghe |
| 1080 | 0.056          | Shanghai honghe |
| 106  | 0.04           | Shanghai honghe |

4. Flame Retardant

In the present invention, a flame retardant can be added to improve the fire-retardant properties of the sheet. The usage amount of the fire retardant in the present invention is 0 to 35 parts by weight (according to the parts by weight of the total weight of the composite material). Brominate-containing flame retardant or phosphorus-containing flame retardant can be used. The preferable flame retardant is not to reduce dielectric properties. The preferable brominate-containing flame retardant is such as decabromodiphenyl ether, decabromodiphenylethane, or ethylenebis(tetrabromophthalimide). The preferable phosphorus-containing flame retardant is such as tris(2,6-dimethylphenyl)phosphin, 10-(2,5-dihydroxyphenyl)-9, 10-dihydro-9-oxa-10-phosphaphenanthrene-10-oxide, 2,6-(2,6-dimethylphenyl)phosphino phenyl or 10-phenyl-9,10-dihydro-9-oxa-10-phosphaphenanthrene-10-oxide.

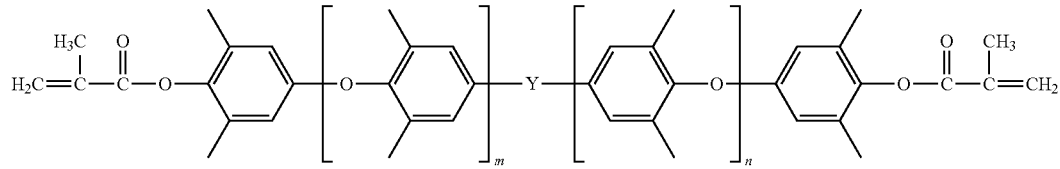

2. Powder Filler

In the composite material of the present invention, the powder filler is employed to increase solid content of the glue liquid, improve the sticky properties of the prepreg, improve the dimensional stability, and reduce CTE. The usage amount of the powder filler in the present invention is 0-55 parts by weight (according to the parts by weight of the total weight of the composite material). The powder filler is such as crystalline silica, amorphous silica, spherical silica, titanium dioxide, strontium titanate, barium titanate, boron nitride, aluminium nitride, silicon carbide, alumina, fiberglass, polytetrafluoroethylene, polyphenylene sulfide, and poly(ether sulfones). The above mentioned fillers can be used by oneself or can be used after being mixed. The 5. Cure Initiator In the composite material of the present invention, the cure initiator is employed to accelerate reaction. When the composite material of the present invention is heated, the cure initiator is decomposed to generate free radicals which enable the molecular chain of the polymer to cross-link. The cure initiator is in an amount of 1%-10% of the usage amount of the thermosetting mixture, and is approximately 1 to 3 parts by weight (according to the parts by weight of the total weight of the composite material). The cure initiator is selected from the materials producing free radicals. The preferable cure initiator is such as dicumyl peroxide, tert-butyl peroxybenzoate, or 2,5-bis(2-ethylhexanoylperoxy)-2, 5-dimethylhexane.

6. Auxiliary Crosslinking Agent

In the composite material of the present invention, a certain amount of auxiliary crosslinking agent can be added to improve the cross-linking density. The auxiliary cross-linking agent can be selected from triallyl isocyanurate, triallyl cyanurate, divinylbenzene, multifunction ACRYLATE, etc.

B. High-Frequency Circuit Substrate Made from the Composite Material

A making method of a high-frequency circuit substrate made from the above mentioned composite material includes the following steps:

Step 1. weighing the components of the composite material, which comprises: (1) 20-70 parts by weight of thermosetting mixture (according to the parts by weight of the total weight of the composite material), component (1) including more than one liquid vinyl resin with the molecular weight being less than 10000 containing polar functional groups, and a polyphenylene ether resin with the molecular weight being less than 5000 containing unsaturated double bonds at the molecule terminal; (2) 10-60 parts by weight of fiberglass cloth; (3) 0-55 parts by weight of powder filler; (4) 1-3 parts by weight of cure initiator; (5) 0-35 parts by weight of flame retardant.

Step 2. mixing the weighed thermosetting mixture, powder filler, flame retardant and cure initiator, diluting the resin system to an appropriate viscosity with a solvent, evenly stirring and mixing to make the filler evenly disperse in the resin system thereby obtaining a glue solution, impregnating the fiberglass cloth in said glue solution and controlling the fiberglass cloth to be at an appropriate thickness, and then removing the solvent to form prepregs.

Step 3. overlapping a plurality of said prepregs, respectively covering a copper foil on both top and bottom surfaces of the overlapped prepregs, putting the prepregs and copper foil assembly into a press machine to cure with a curing temperature of 150-300° C. and a curing pressure of 25-70 Kg/cm$^2$, thereby forming said high-frequency circuit substrate.

The made high-frequency circuit substrate comprises: a plurality of prepregs mutually overlapped and copper foils respectively covered on both sides of the overlapped prepregs. Each prepreg is made from the composite material.

The dielectric properties of the above mentioned made high-frequency circuit substrate, that is, dielectric constant, dielectric loss tangent, high-frequency property and heat resistance, will be best understood from the following detailed description with reference to the accompanying embodiments.

The components of the composite material selected in the embodiments of the present invention are shown in the following Table 2.

TABLE 2

| manufacturer | name or trademark | the content of the material |
|---|---|---|
| Sartomer | Ricon 131MA20 | maleic anhydride modified polybutadiene resin |
| Sartomer | Ricon 100 | polybutadiene styrene copolymer resin |
| SABIC | MX9000 | acrylate terminated PPO, the Mn being about 1600 |
| Sibelco | 525 | fused amorphous silica |
| Albemarle | SAYTEX8010 | decabromodiphenylethane |
| Shanghai gaoqiao | DCP | dicumyl peroxide |
| Shanghai honghe | 1080 fiberglass cloth | thickness 0.05 mm, weight 48 g/m$^2$ |

Embodiment 1

Mix 55.6 parts by weight of maleic anhydride modified polybutadiene resin (Rican 131MA20), 44.4 parts by weight of the acrylate terminated PPO, 85 parts by weight of silica (525), 32 parts by weight of fire retardant decabromodiphenylethane (SAYTEX8010), and 6.5 parts by weight of cure initiator dicumyl peroxide (DCP) together, dilute to an appropriate viscosity with solvent xylene, and then evenly stir and mix to make the filler evenly disperse in the resin system, thereby obtaining a glue solution Impregnate 1080 fiberglass cloth with the glue solution, then dry the fiberglass cloth to remove the solvent thereby obtaining prepregs. Since the prepreg is not sticky, the process operation is simple. Overlap eight made prepregs, and cover two copper foils of 1 oz (ounce) thickness on both top and bottom surfaces of the overlapped prepregs, and then put the assembly of two copper foils and eight prepregs into a press machine to cure for 2 hours with a curing pressure of 50 Kg/cm$^2$ and a curing temperature of 190° C. The physical data are as shown in Table 3.

Embodiment 2

The process of embodiment 2 is similar to the embodiment 1, but the changed ratio of the composite material and the physical data thereof are as shown in table 3.

Embodiment 3

The process of embodiment 3 is similar to the embodiment 1, but the changed ratio of the composite material and the physical data thereof are as shown in table 3.

Comparison Example

The process of the comparison example is similar to the embodiment 1. The maleic anhydride modified polybutadiene resin (Rican 131MA20), and acrylate terminated PPO (MX9000) are replaced with a polybutadiene styrene copolymer resin (Rican 100), and the mold temperature is kept at 300° C. for 30 minutes. The ratio of the material is shown in table 3.

TABLE 3 the ratio of the composite material and the physical data thereof of the embodiments and the comparison example

| Materials and Properties | Embodiment 1 | Embodiment 2 | Embodiment 3 | Comparison example |
|---|---|---|---|---|
| Ricon 131MA20 | 55.6 | 62 | 38 | 0 |
| Ricon 100 | 0 | 0 | 0 | 100 |
| MX9000 | 44.4 | 38 | 52 | 0 |
| 525 | 85 | 240 | 45 | 85 |
| DCP | 6.5 | 7.5 | 5.6 | 5.8 |
| SAYTEX8010 | 32 | 35 | 0 | 28 |
| 1080 fiberglass cloth | 80.7 | 125 | 78 | 92 |
| peel strength (N/mm) | 1.25 | 1.31 | 1.20 | 0.52 |
| dielectric constant (10 GHZ) | 3.25 | 3.43 | 3.34 | 3.15 |
| dielectric loss tangent (10 GHZ) | 0.0053 | 0.0063 | 0.005 | 0.0026 |
| solder leach resistance 288° C., (s) | >120 | >120 | >120 | >120 |

TABLE 3-continued the ratio of the composite material and the physical data thereof of the embodiments and the comparison example

| Materials and Properties | Embodiment 1 | Embodiment 2 | Embodiment 3 | Comparison example |
|---|---|---|---|---|
| sticky property of prepregs | non-sticky | non-sticky | non-sticky | sticky |
| flexural strength, MPa | 320 | 258 | 380 | 260 |
| T288 (min.) | >15 | >15 | >15 | 2 |

Physical Analysis

From the physical data of diagram 3, the circuit substrates made in embodiments 1, 2 and 3 have low dielectric constants, low dielectric loss tangents, and excellent high-frequency properties. Comparing with the comparison example, the acrylate terminated PPO is introduced to the embodiments 1, 2 and 3, which effectively improves the sticky property of prepregs and the flexural strength. The prepregs of the embodiments 1, 2 and 3 have very good heat resistance, which can endure a constant temperature of 288° C. for 15 minutes. Moreover, the dielectric constant and dielectric loss tangent are all small, and the peel strength is also improved.

As mentioned above, comparing with a common copper foil substrate, the circuit substrate of the present invention has more excellent dielectric properties, namely comparatively low dielectric constant, low dielectric loss tangent, and excellent high-frequency properties.

Although the present invention has been described in detail with above said preferred embodiments, but it is not to limit the scope of the invention. So, all the modifications and changes according to the characteristic and spirit of the present invention, are involved in the protected scope of the invention.

What is claimed is:

1. A composite material comprising:
   (1) 20-70 parts by weight of thermosetting mixture, the thermosetting mixture including a maleic anhydride modified polybutadiene resin with a molecular weight being less than 10000 and an acrylate terminated PPO with a molecular weight being less than 5000;
   (2) 10-60 parts by weight of fiberglass cloth;
   (3) 0-55 parts by weight of powder filler;
   (4) 1-3 parts by weight of cure initiator;
   (5) 0-35 parts by weight of flame retardant;
wherein the maleic anhydride modified polybutadiene resin comprises 15%-75% of the weight of the thermosetting mixture; the content of 1,2-addition vinyl in its molecular structure is more than or equal to 70%.

2. The composite material of claim 1, wherein the acrylate terminated PPO comprises 25%-85% of the weight of the thermosetting mixture.

3. The composite material of claim 1, wherein the acrylate terminated PPO uses the maleic anhydride modified polybutadiene resin for curing cross-linked reaction.

4. The composite material of claim 1, wherein the powder filler is one or more selected from crystalline silica, amorphous silica, spherical silica, titanium dioxide, strontium titanate, barium titanate, boron nitride, aluminum nitride, silicon carbide, alumina, fiberglass, polytetrafluoroethylene, polyphenylene sulfide, and poly(ether sulfones).

5. The composite material of claim 1, wherein the flame retardant is a bromine-containing or phosphorus-containing flame retardant; the bromine-containing flame retardant is selected from the group consisting of decabromodiphenyl ether, decabromodiphenylethane, and ethylenebis(tetrabromophthalimide); the phosphorus-containing flame retardant is selected from the group consisting of tris(2,8-dimethylphenyl)phosphin, 10-(2,5-dihydroxyphenyl)-9,10-dihydro-9-oxa-10-phosphaphenanthrene-10-Oxide, 2,6-(2,6-dimethylphenyl)phosphine phenyl, and 10-phenyl-9,10-dihydro-9-oxa-10-phosphaphenanthrene-10-Oxide.

6. The composite material of claim 1, wherein the cure initiator is selected from the group consisting of dicumyl peroxide, tert-butyl peroxybenzoate, and 2,5-bis(2-ethylhexanoylperoxy)-2,5-dimethylhexane.

7. The composite material of claim 1, further comprising an auxiliary crosslinking agent that is selected from triallyl isocyanurate triallyl cyanurate, divinylbenzene, and multifunction acrylate.

* * * * *